United States Patent [19]
Lee et al.

[11] Patent Number: 5,840,446
[45] Date of Patent: Nov. 24, 1998

[54] MASK FOR MONITORING DEFECT

[75] Inventors: Geun Ho Lee, Seoul; Jeong Hwy Kim, Ichon-Shi, both of Rep. of Korea

[73] Assignee: Hyundai Electronics Industries Co., Ltd., Kyungki-Do, Rep. of Korea

[21] Appl. No.: 666,885

[22] Filed: Jun. 19, 1996

[30] Foreign Application Priority Data

Jun. 24, 1995 [KR] Rep. of Korea ............... 1995 17293

[51] Int. Cl.$^6$ ............................................. G03F 9/00
[52] U.S. Cl. ................................................ 430/5
[58] Field of Search ............... 430/5; 382/147, 382/148, 149

[56] References Cited

U.S. PATENT DOCUMENTS 5,405,810  4/1995  Mizumo et al. ..................... 437/229
5,513,275  4/1996  Khalaj et al. ........................ 382/149

*Primary Examiner*—S. Rosasco
*Attorney, Agent, or Firm*—Fish & Richardson P.C.

[57] ABSTRACT

The mask of the present invention consists of a first pad provided thereto, a second pad opposing the first pad at a given distance therefrom, a zigzag-shaped line formed to interconnect the first pad and the second pad, and a plurality of unit patterns arranged to interconnect the first pad, the second pad and the line on the quartz substrate. The mask of the present invention makes it possible to have a quantitative, qualitative and classified analysis for the defect because it can not only analyze the occurrence frequency of the defects by the defect inspection system but also can have an electrical measurement.

8 Claims, 1 Drawing Sheet

MASK FOR MONITORING DEFECT

FIELD OF THE INVENTION

The present invention relates to a mask which can monitor defects that occur during each step of the manufacturing processes of the semiconductor device and defects that occur from every apparatus used in the manufacturing process of the semiconductor device.

BACKGROUND OF THE INVENTION

Among items which are monitored in the process of manufacturing the semiconductor device, an item related to defects becomes more problematic as the integration of the device becomes greater and the field size becomes larger. As a result, monitoring and managing defects becomes even more important since it is directly related to the throughput of the device. A conventional defect monitoring method monitors defects occurring from real wafers or various apparatus which are used in the process of manufacturing the semiconductor device. Defects occurring from an apparatus are quantitatively analyzed and a defect occurrence frequency is determined by periodically inspecting the apparatus using a bare wafer before each manufacturing process. Because the method can only analyze quantitatively, it is difficult to set up a basis for periodical maintenance for the apparatus and therefore it can not maintain the optimized management for the apparatus. Also, the method for monitoring defects which occurred during the manufacturing process on the wafer, on which an expected pattern is formed, reviewed the defect occurrence frequency after every single manufacturing process. This method made it possible to have a quantitative analysis but made it difficult to classify defects directly affecting the throughput of the device.

SUMMARY OF THE INVENTION

Accordingly, the purpose of the present invention is to provide a mask for monitoring defect, which when used with an inspection system can provide an efficient management of the apparatus and improve the throughput of the device, by making a mask which can analyze exactly defects occurring during the manufacturing processes and from the apparatus and then monitoring defects using the mask.

To achieve the above purpose, a mask for monitoring a defect being characterized in that: there is provided a first pad, there is provided a second pad opposing the first pad at a given distance therefrom, there is formed a zigzag-shaped line to interconnect the first pad and the second pad, and there are arranged a plurality of unit patterns interconnecting the first pad and a second pad on the quartz substrate.

BRIEF DESCRIPTION OF THE DRAWINGS

For fuller understanding of the nature and objects of the invention, reference should be made to the following detailed description taken in conjunction with the accompanying drawings in which.

Similar reference characters refer to similar parts through the several views of the drawings.

DESCRIPTION OF THE INVENTION

Below, the present invention will be described in detail by reference to the accompanying drawings.

Figure 1:
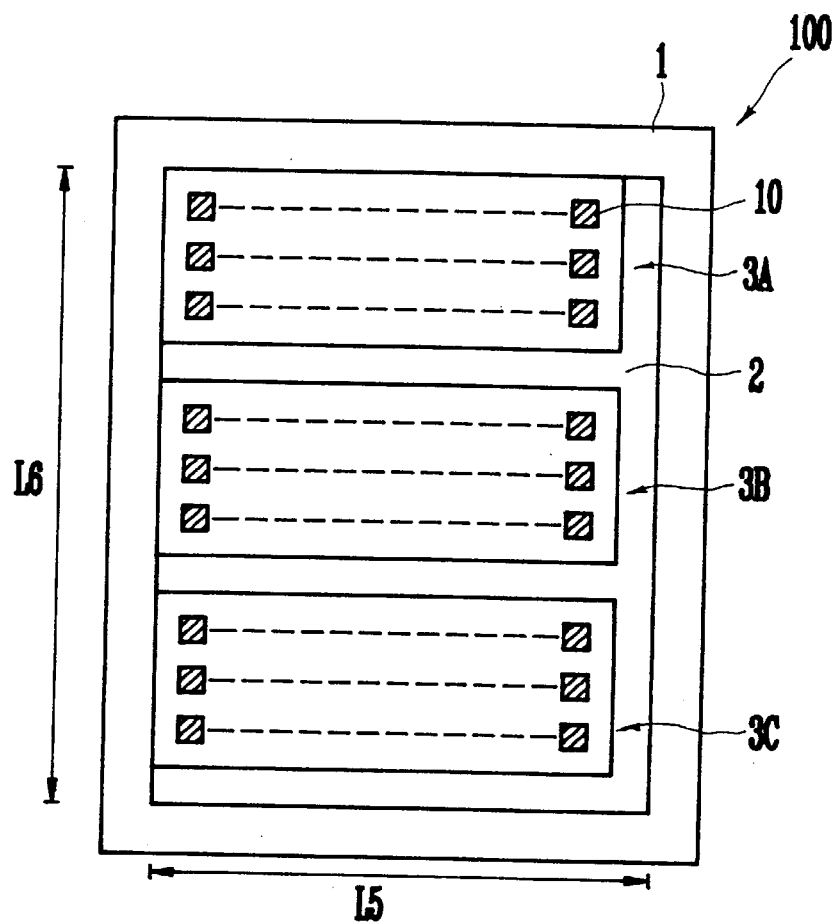
FIG. 1 is a flat view of the mask for monitoring defect according to the present invention.
Figure 2:
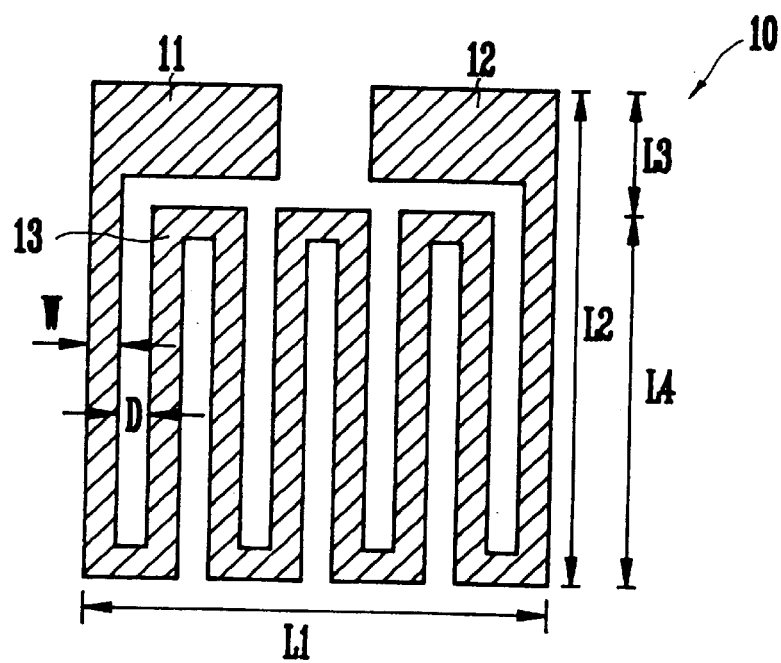
FIG. 2 is a detailed drawing of the unit pattern.

FIG. 1 is a flat view of the mask for monitoring defect according to the present invention and FIG. 2 is a detailed drawing of a unit pattern of FIG. 1.

Referring to FIG. 1, there are first through third field regions 3A, 3B and 3C which are formed on a quartz substrate 1 and divided by a scribe line 2. A plurality of unit patterns 10 are arranged within each internal portion of the first through third field regions 3A, 3B and 3C. Therefore, the mask 100 for monitoring defect according to the present invention is manufactured by forming first through third regions 3A, 3B and 3C in which a plurality of unit patterns 10 are arranged on a quartz substrate 1.

As shown in FIG. 2, a first pad 11 is formed on the substrate 1, a second pad 12 is formed directly across the first pad 11 at a given distance therefrom. A zigzag-shaped third pad 13 is formed to interconnect the first pad 11 and the second pad 12, and therefore the unit pattern 10 is made of the first pad 11, the second pad 12 and the third pad 13 which are interconnected. The unit pattern 10 is formed as chrome. Unit pattern 10 is rectangular, in which its horizontal length "L1" is 450 to 550 um and its vertical length "L2" is 900 to 1100 um. The first and second pads 11 and 12 of the unit pattern 10 are formed to be within the ranges of 450 through 550 $\mu$m in its horizontal length "L1" and 150 through 250 $\mu$m in its vertical length "L3" at the upper region of the square. The third pattern 13 of the unit pattern 10 is formed to be within the ranges of 450 through 550 $\mu$m in its horizontal length "L1" and 750 through 850 $\mu$m in its the vertical length "L4" at the lower region of the square.

The width "W" of the third pattern 13 in the unit pattern 10 and the distance "D" between the neighboring pattern 13 is formed to comply with the minimum feature size of the layer which will be formed during the manufacturing process of the device.

As shown in FIG. 1, the unit pattern 10 to have the above structure is consists of one row of 30 which are horizontally arranged on the quartz substrate 1 and one column of 9 which are vertically arranged on the quartz substrate 1. Therefore, a plurality of unit patterns 10 are consisted of 30 columns and 9 rows on the quartz substrate 1. Also, an unit field region is consisted of 3 rows among 9 rows in which a plurality of unit patterns 10 are arranged. Accordingly, there exist 3 rows at each of the first through third field regions 3A, 3B and 3C.

Though each size of the width "W" of the pattern 13 in the unit pattern 10 and the distance "D" between the neighboring patterns 13 applicable to the mask 100 of the present invention is basically made to comply with the minimum feature size which will be formed during each process for manufacturing the device, each size of the width "W" of the pattern 13 in the unit pattern 10 and the distance "D" between the neighboring patterns 13 which are located at every row is formed to be different so as to easily monitor defects occurring during many manufacturing processes by using one mask. For example, the first row is formed to comply with the minimum feature size of an insulating film so as to monitor defects occurring at a given insulating film which will be formed during the manufacturing process of the device and the second row is formed to comply with the minimum feature size of a conducting layer so as to monitor defects occurring at a given conducting layer (for example. polysilicon, silicide, metal etc.) which will be formed during the manufacturing process of device. And, the third and fourth rows are formed to comply with the minimum feature size of an insulating film so as to monitor defect occurring from a given insulating film that are formed during the manufacturing process of the device.

The first through third regions 3A, 3B and 3C are formed to be within the ranges of 14000 through 170001 μm in its horizontal length "L5" and 85000 through 105001 μm in its vertical length "L6".

The process of manufacturing a given insulating film and a conducting layer during the manufacturing process of the semiconductor device using the mask 100 of the present invention and the method of monitoring defect occurring at the apparatus used to form it will be explained shortly.

The defect occurring from the lithography and etching process for forming an insulating film having a given pattern and the method of monitoring defect occurring at the apparatus used for these processes will be explained as follows.

An insulating film is formed on a bare wafer and photoresist is coated on the insulating film. Then, an exposure process is performed using the mask of the present invention, thereby forming a plurality of photoresist patterns, each photoresist pattern having a shape resembling the unit pattern 10. After the photoresist patterns are formed, inspection is performed by conventional method using the inspection system. Accordingly, a plurality of inspection data can be obtained using one wafer, thereby obtaining occurrence frequency of defects occurring from the lithography process at one time.

The insulating film exposed by the exposure process is etched through an etching process using the photoresist pattern as a mask, thereby forming a plurality of insulating films having a shape resembling the unit pattern 10. After the insulating films are formed, inspection is performed by a conventional method using the inspection system. A plurality of inspection data can be obtained using one wafer, thereby obtaining occurrence frequency of defects occurring from the etching process at one time.

The defect occurring during the lithography and etching process for forming a conducting layer having a given pattern and the method of monitoring defect occurring at the apparatus used for these processes will be explained as follows.

A conducting layer is formed on a bare wafer and photoresist is coated on the conducting layer. Then, an exposure process is performed using the mask, thereby forming a plurality of photoresist patterns, each photoresist pattern having a shape resembling the unit pattern 10. After the photoresist patterns are formed, inspection is performed by the conventional method using the inspection system. Accordingly, a plurality of inspection data can be obtained using one wafer, thereby obtaining occurrence frequency of defects occurring from the lithography process at one time.

The conducting layer exposed by the exposure process is etched through an etching process using the photoresist pattern as a mask, thereby forming a plurality of conducting layers having a shape resembling the unit pattern 10. After the conducting layers are formed, inspection is performed by the conventional method using the inspection system. A plurality of inspection data can be obtained using one wafer, thereby obtaining occurrence frequency of defects occurring from the etching process at one time.

Also, after the conducting layers are formed, defects of the conducting layers can be detected by measuring a resistance of each conducting layer.

As mentioned above, the mask of the present invention makes it possible to have a quantitative, qualitative and classified analysis for the defect because it can not only analyze occurrence frequency of the defects by the inspection system but also can have an electrical measurement. The present invention can increase the throughput of the device since it not only facilitates the establishment of a basis for periodic maintenance of the apparatus but also improves the productivity through increase of apparatus management and up-time.

The foregoing description, although described in its preferred embodiment with a certain degree of particularity, is only illustrative of the principle of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

What is claimed is:

1. A mask for monitoring a defect, comprising:
    first, second, and third field regions which are formed on a quartz substrate and divided by a scribe line;
    a plurality of unit patterns, each of which has the same pattern structure, formed within each internal portion of said first, second, and third field regions,
    wherein said unit patterns comprising:
        a first pad formed on said internal portion;
        a second pad formed at the side of said first pad at a specific distance therefrom; and
        a zigzag-shaped third pad formed to interconnect said first and second pads.

2. A mask for monitoring a defect as recited claim 1, wherein said unit patterns are formed of chrome.

3. A mask for monitoring a defect as recited claim 1, wherein the entire shape of said unit patterns is a rectangular shape of 450 through 550 μm in its horizontal length and 900 through 1100 μm in its vertical length, wherein the first and second pads of the unit pattern are formed to be included within the ranges of 450 through 550 μm in its horizontal length and 150 through 250 μm in its vertical length at the upper region of the rectangular shape, and wherein the line of the unit pattern is formed to be included within the ranges of 450 through 550 μm in its horizontal length and 750 through 850 μm in its the vertical length at the lower region of the rectangular shape.

4. A mask for monitoring a defect as recited claim 1, wherein said plurality of unit patterns are consisted one row of 30 horizontally arranged on the quartz substrate and one column of 9 vertically arranged on the quartz substrate, thereby consisting of 30 columns and 9 rows on the quartz substrate to form a plurality of unit patterns.

5. A mask for monitoring a defect as recited claim 4, wherein said 9 rows, in which said plurality of unit patterns are arranged, are divided into each of 3 rows by a scribe line and thereby first through three regions are formed on the quartz substrate.

6. A mask for monitoring a defect as recited claim 5, wherein said first through third regions are formed to be included within the ranges of 14000 through 17000 μm in its horizontal length and 85000 through 10500 μm in its vertical length.

7. A mask for monitoring a defect as recited claim 1, wherein said each size of the width of the line in the unit pattern and the distance between the neighboring lines is formed to comply with the minimum feature size of the layer which will be formed during the manufacturing process of the device.

8. A mask for monitoring a defect as recited claim 1, wherein said each size of the width of the line in the unit pattern and the distance between the neighboring lines is formed to be different based on a plurality of rows in which said plurality of unit patterns are arranged.

* * * * *